United States Patent
Wehl et al.

(10) Patent No.: US 6,773,084 B1
(45) Date of Patent: Aug. 10, 2004

(54) PRINTING CHIP FOR A PRINTING HEAD WORKING ACCORDING TO THE INK-JET PRINTING PRINCIPLE

(75) Inventors: Wolfgang Wehl, Heilbronn (DE); Jörg Wild, Heilbronn (DE); Peter Krause, Frankfurt an der Oder (DE)

(73) Assignee: EKRA Edward Kraft GmbH, Gonnigheim (DE)

( * ) Notice: Subject to any disclaimer, the term of this patent is extended or adjusted under 35 U.S.C. 154(b) by 103 days.

(21) Appl. No.: 10/030,069

(22) PCT Filed: Jul. 6, 2000

(86) PCT No.: PCT/EP00/06405

§ 371 (c)(1),
(2), (4) Date: Jun. 7, 2002

(87) PCT Pub. No.: WO01/02122

PCT Pub. Date: Jan. 11, 2001

(30) Foreign Application Priority Data

Jul. 6, 1999  (DE) .......................................... 199 31 110

(51) Int. Cl.7 ............................. B41J 2/195; B41J 2/045
(52) U.S. Cl. ................................ 347/7; 347/70; 347/71
(58) Field of Search .............................. 347/7, 70, 71, 347/72, 47, 65; 29/25, 35

(56) References Cited

U.S. PATENT DOCUMENTS 4,835,554 A    5/1989   Hoisington et al.
4,897,903 A  * 2/1990   Johannsen ................. 29/25.35
5,810,988 A    9/1998   Smith, Jr. et al.
6,220,698 B1 * 4/2001   Katakura ..................... 347/68

FOREIGN PATENT DOCUMENTS

| | | |
|---|---|---|
| EP | 0 390 346 | 10/1990 |
| EP | 0 434 946 | 7/1991 |
| EP | 0 678 387 | 10/1995 |
| EP | 0 895 866 | 2/1999 |
| EP | 0 917 956 | 5/1999 |
| GB | 2 297 725 | 8/1996 |
| JP | 10095113 A | 4/1998 |
| JP | 10315461 A | 12/1998 |
| JP | 11000992 A | 1/1999 |
| WO | WO 97/34769 | 9/1997 |

* cited by examiner

Primary Examiner—Stephen D. Meier
Assistant Examiner—Alfred E Dudding
(74) Attorney, Agent, or Firm—Bateman IP Law Group

(57) ABSTRACT

The invention relates to a printing chip for a printing head working according to the ink-jet printing principle, having at least one recess forming a medium chamber in the printing chip, a deflectable diaphragm forming one wall of the medium chamber, a duct opening in the medium chamber for feeding a liquid medium that is to be squirted out hot, and having a squirting-out opening connected to the medium chamber, which printing chip is distinguished by the fact that the printing chip (2) is produced exclusively from monocrystalline silicon.

22 Claims, 4 Drawing Sheets

Figure 1:
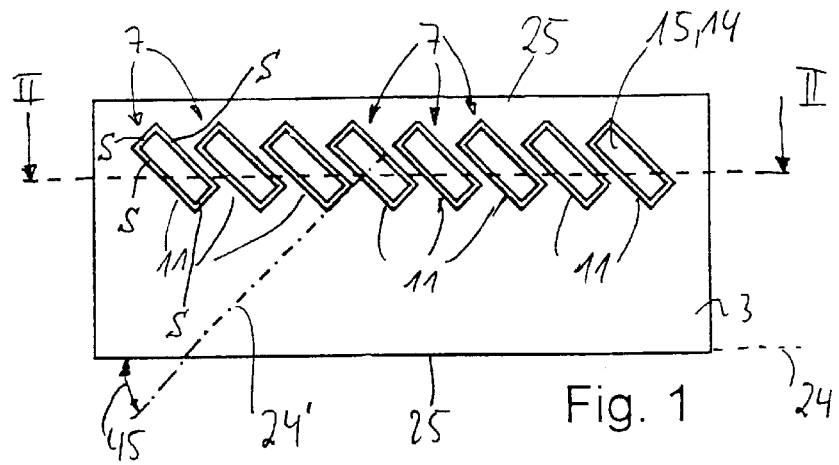

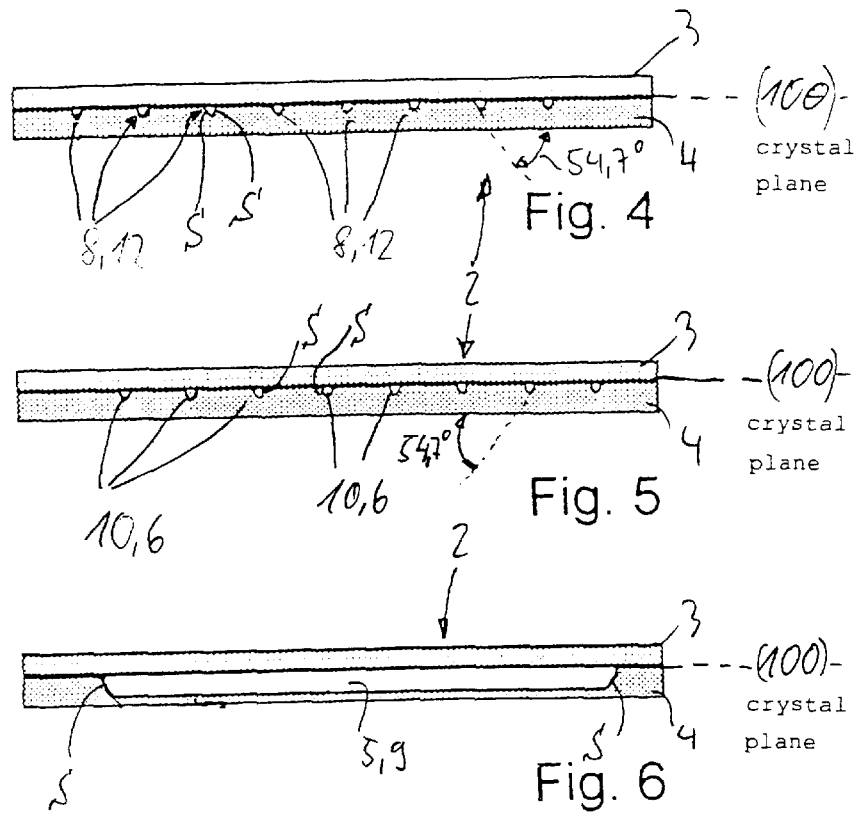
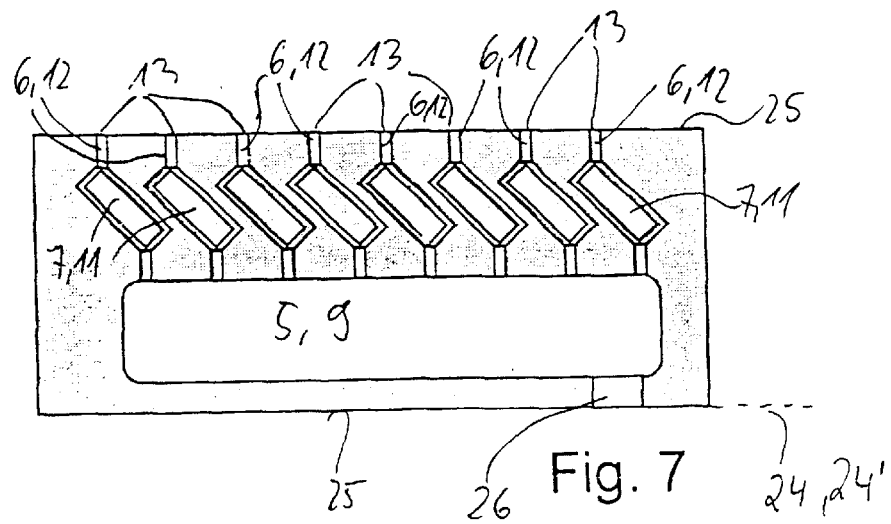

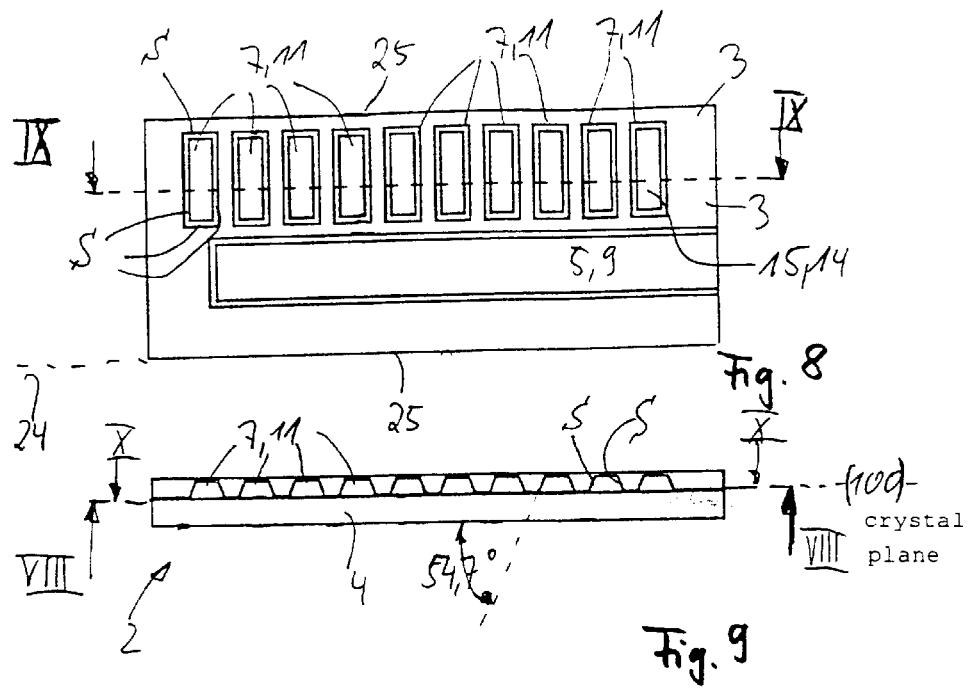
Fig. 8
Fig. 9
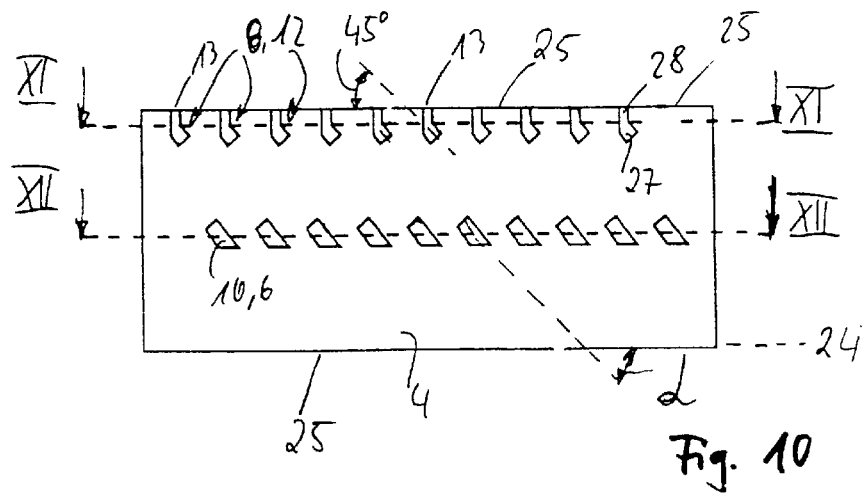
Fig. 10

(100)-Kristallebene

PRINTING CHIP FOR A PRINTING HEAD WORKING ACCORDING TO THE INK-JET PRINTING PRINCIPLE

The present application is the U.S. National phase of PCT Application No. PCT/EP00/06405 filed Jul. 6, 2000, which claims priority to German Pat. App. No. 19931110.2 filed Jul. 6, 1999.

The invention is based on a printing chip for a printing head working according to the ink-jet printing principle, in accordance with the preamble of claim 1.

DE 44 43 254 C1 discloses a printing chip of the generic type. This printing chip has a medium chamber formed by a recess in a glass plate, which is also referred to as a support plate. The recess is made to such a depth in the glass plate that the bottom of the recess serves as a deflectable diaphragm, which thus forms one wall of the medium chamber. A duct for feeding an ink that is to be squirted out opens in the medium chamber. Furthermore, a squirting-out opening is provided, which is connected to the medium chamber. The recesses introduced in the glass plate are closed off by a central plate. The known printing chip is thus formed from two substrate parts lying one on top of the other, at least one substrate part being composed of glass.

This known printing chip has the disadvantage that it is not suitable, for lack of thermal stability, for squirting out very hot media at temperatures above 500° C.

The object of the invention, therefore, is to specify a printing chip of the type mentioned in the introduction which does not have this disadvantage.

This object is achieved by means of a printing chip for a printing head working according to the ink-jet printing principle, the printing chip having the features of claim 1. It thus has at least one medium chamber formed by a recess in the printing chip. Furthermore, a deflectable diaphragm is provided, which forms one wall of the medium chamber. Moreover, a duct for feeding a liquid medium that is to be squirted out hot opens in the medium chamber. In addition, the printing chip has a squirting-out opening connected to the medium chamber. According to the invention, the printing chip is distinguished by the fact that it is produced exclusively from monocrystalline silicon. The printing chip according to the invention is distinguished by high operational reliability when media at temperatures reaching in excess of 1000° C. are sprayed. The known printing chips comprising glass cannot be used to spray such hot media since the glass softens at these temperatures, so that the diaphragm is damaged and/or can no longer be deflected in a reproducible manner, as a result of which an exact drop volume can no longer be ejected from the squirting-out opening. The printing chip according to the invention is also distinguished by the fact that the monocrystalline silicon can be processed according to known and proven fabrication processes in order to be able to produce the medium chamber and the remaining ducts and/or the squirting-out opening.

One development of the invention provides for the printing chip to be formed from at least two substrate parts lying one on top of the other. This affords the advantage for production that the required recesses for the medium chamber and the ducts and also the squirting-out opening can be introduced from one side on the substrate parts. The recesses are then closed off by the substrate parts being laid one on top of the other. The printing chip comprising two substrate parts lying one on top of the other is thus simple and cost-effective to produce.

According to a particularly preferred exemplary embodiment, the feeding duct, the medium chamber and the squirting-out opening are arranged in the printing chip in such a way that the medium to be squirted out flows alternately through the substrate parts. What is advantageous in this case is that it is possible to produce the recesses at least for the medium chamber, the feeding duct and squirting-out opening in the two substrate parts using different fabrication processes. Thus, by way of example, one of the substrate parts can be processed by anisotropic wet etching and the other substrate part by dry etching or another material-removing process, in order to introduce the recesses. By rotating the (100) silicon crystal plane of one of the substrate parts by 45° relative to the other substrate part, it is possible for all of the recesses to be formed favourably in terms of flow properties in the course of the anisotropic wet etching. Since both substrate parts are produced from silicon, which has very good thermal conductivity, strain nevertheless does not arise in the printing chip on account of thermal expansion.

A preferred exemplary embodiment provides for a medium supply chamber, to which the feeding duct is connected, to be located in the printing chip. It is thus possible to provide a large-scale integrated printing chip which contains all the essential functional units. If appropriate, however, it would also be conceivable to design the medium supply chamber, which can also be referred to as a storage chamber, in a separate structural part which can then be fixed to the printing chip. However, if the medium supply chamber is realized in the printing chip, all functionally essential parts can be realized by recesses that are simple to produce in the substrate parts.

A preferred exemplary embodiment provides for the printing chip surfaces, in particular those which come into contact with the hot medium, to be provided with a coating that is resistant to high temperatures. Thus, the hot liquid medium cannot damage the printing chip substrate even over a long service life of the printing chip.

It is preferably provided that the printing chip surfaces, in particular those which come into contact with the hot medium, are passivated by thermal oxide. The thermal oxide is preferably provided on the channel walls and the wall of the medium chamber. In particular, then, the printing chip surfaces past which the hot medium flows are passivated with thermal oxide.

In a particularly preferred exemplary embodiment, the two substrate parts are connected to one another inseparably by silicon fusion bonding. This connection method, which can only be employed for silicon-silicon, ensures reliable connection of the two substrate parts even at operating temperatures of far in excess of 1000° C. Consequently, by comparison with known printing chips, the printing chip is also distinguished by temperature-resistant connection of the two substrate parts to one another.

According to a preferred exemplary embodiment, the recess for the medium chamber, the feeding duct, the squirting-out opening and the medium supply chamber are produced by an anisotropic wet or dry etching process, in particular anisotropic wet etching using potassium hydroxide (KOH) being preferred. It goes without saying that other basic etching solutions, in particular alkaline metal hydroxide solutions, can be used. Anisotropic etching in monocrystalline silicon with (100) orientation produces the recesses for the ducts and the medium chamber always with four pyramidally inclined side walls on the (111) crystal planes. Their angle with respect to the (100) crystal plane of the substrate surface of the silicon is 54.7° on all sides. The dimensions of the recesses can be produced very accurately in this etching process. This affords the advantage, in particular in the substrate part having the recess for the medium chamber, that the diaphragm area can be produced very accurately, if the said diaphragm area is formed by the bottom of the recess. The diaphragm area is thus merely dependent on the opening width of the etching mask and the depth to be etched for the recess. Since the angle of the side walls always has the same value, the effective diaphragm area can thus be produced particularly accurately in a manner dependent on the opening width of the perforated mask and the depth of the recess. If a plurality of medium chambers each having a deflectable diaphragm are provided, all of the diaphragms have essentially the same area in this production process, so that, given the same deflection excursion of the diaphragm, the same drop size can be ejected from each chamber. In particular, the printing chip is thus distinguished by highly accurate drop volumes that can be squirted out.

In a preferred embodiment, the medium chamber, the feeding duct and the squirting-out opening have—as seen in the flow direction of the medium—a trapezoidal or V-shaped cross section. By the choice of monocrystalline (100) silicon, these cross sections can be produced very accurately since—as mentioned above—the side walls always form an angle of 54.7° with the (100) crystal plane.

Preferably, it is also provided that the medium chamber is of rectangular design in plan view, and that the feeding duct opens in the medium chamber, and the squirting-out opening is connected to the medium chamber, in such a way that the medium flows through the said medium chamber essentially diagonally. The effect that is thus achieved, in a particularly advantageous manner, is that zones in which the medium to be squirted out remains, as might happen for example in the corners of the rectangular medium chamber, cannot form in the medium chamber. The diagonal throughflow of the medium chamber reliably avoids such deposits, which could ultimately also lead to closure of the medium chamber. Moreover, the diagonal throughflow of the medium chamber ensures that gas inclusions present in the medium are reliably flushed out. Of course, the medium chamber could also be square—as seen in plan view.

According to a preferred exemplary embodiment, the medium chamber, the feeding duct, the squirting-out opening and the medium supply chamber are introduced from the (100) crystal plane or a plane of the silicon that is parallel thereto, so that the side walls for the said recesses are present at the abovementioned angle of 54.7°.

In order to achieve the diagonal throughflow of the medium chamber, the feeding duct and a connecting duct, which connects the squirting-out opening to the medium chamber, run at an angle of 45° relative to a second crystal plane perpendicular to the (100) crystal plane, the longitudinal extent of the medium chamber then preferably being perpendicular to the said second crystal plane. As an alternative, however, it is also conceivable for the medium chamber to run at an angle of 45° with respect to the said second crystal plane. The feeding duct and the connecting duct then run essentially perpendicularly to the crystal plane, so that in this case, too, it is again ensured that the medium chamber experiences diagonal throughflow.

As mentioned above, in a preferred embodiment, the diaphragm is formed by the bottom of the recess. In this case, the etching time or etching depth for producing this recess is dimensioned in such a way that the diaphragm preferably has a thickness of approximately 20 to 100 $\mu$m.

In a preferred exemplary embodiment, the connecting duct has at least one partial duct perpendicular to the second crystal plane, the squirting-out opening being formed by the orifice of the said partial duct. In other words, a partial duct to the squirting-out opening then leads to the edge area of the printing chip, the said partial duct running perpendicularly to the said edge area, so that the medium emerges from the squirting-out opening preferably at an angle of 90°, as a result of which the drop can also be applied to the desired point on a substrate to be treated.

In a preferred embodiment, the feeding duct has a constricting point or is itself designed as a constriction. The flow rate or the volumetric flow from the medium supply chamber into the medium chamber can thus be set in a particularly simple manner. When the diaphragm is deflected, the constriction additionally prevents the medium from being forced from the medium chamber back into the supply chamber.

A particularly preferred exemplary embodiment is distinguished by the fact that the medium chamber and the supply chamber are located in one of the substrate parts and are delimited with respect to one another by a web, and that the feeding duct is formed in the other of the substrate parts and is located under the free end of the web. An overflow possibility for the medium from the supply chamber to the medium chamber is thus formed in a simple manner, in which case, moreover, the constricting point may be formed by the web.

Preference is attached to an exemplary embodiment of the printing chip in which a plurality of medium chambers, feeding ducts, connecting ducts and squirting-out openings are provided, so that the hot medium to be squirted out can be ejected simultaneously or in succession.

In a preferred exemplary embodiment, the printing chip has a heating element which heats the medium located in the supply chamber in order that it remains liquid and can be squirted out. In this case, it is preferred for at least one heating element to be fitted on the printing chip in such a way that it is located on the outer side of at least one of the substrate parts. As an alternative, it would also be conceivable for the medium that is to be squirted out to be introduced into the supply chamber such that it is already hot or preheated to such an extent that heating on the printing chip itself is not necessary. However, it is also possible to provide an external heating device, for example a halogen lamp, for heating the medium.

A preferred exemplary embodiment of the printing chip is distinguished by the fact that a temperature sensor is provided, which monitors the medium temperature, in particular. For this purpose, provision is made, in particular, of one temperature sensor located on the outer side on at least one of the substrate parts. Through the combination of temperature sensor and heating element, the printing chip can be kept at a temperature in such a way that the hot liquid medium in the printing chip neither undesirably solidifies nor is overheated, so that permanently good squirting-out results can be obtained.

Further refinements are specified in the subclaims.

The printing chip described above is used, in a preferred use, in particular, for squirting out hot liquid media whose temperature may reach far in excess of 1000° C. The printing chip according to the invention affords advantages particularly in the case of liquid media whose melting point lies in this temperature range, so that metals, metal compounds or alloys and even glasses having a low melting point can be squirted out using the printing chip according to the invention.

Figure 2:
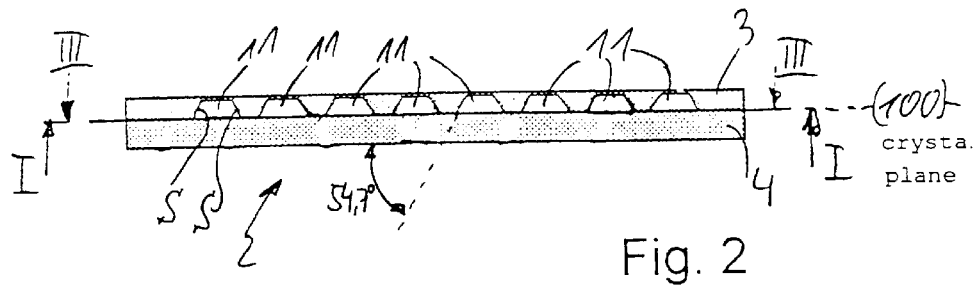
Figure 3:
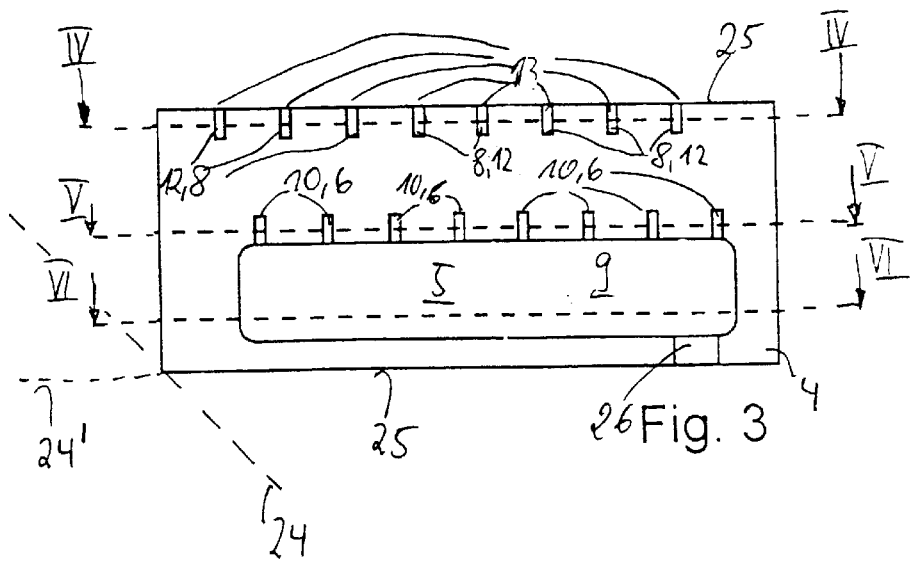
Figure 11:
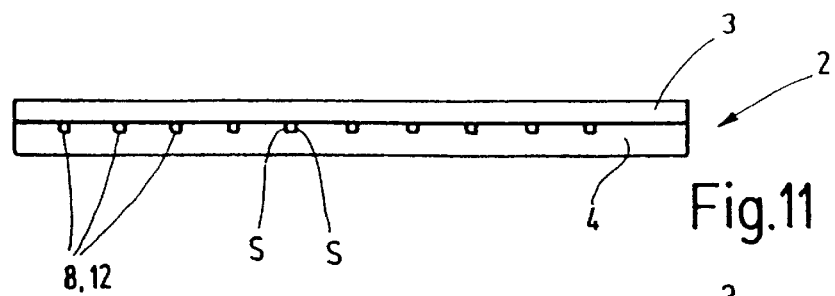
Figure 12:
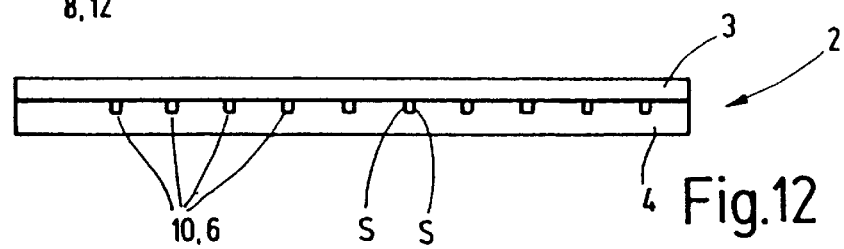
Figure 13:
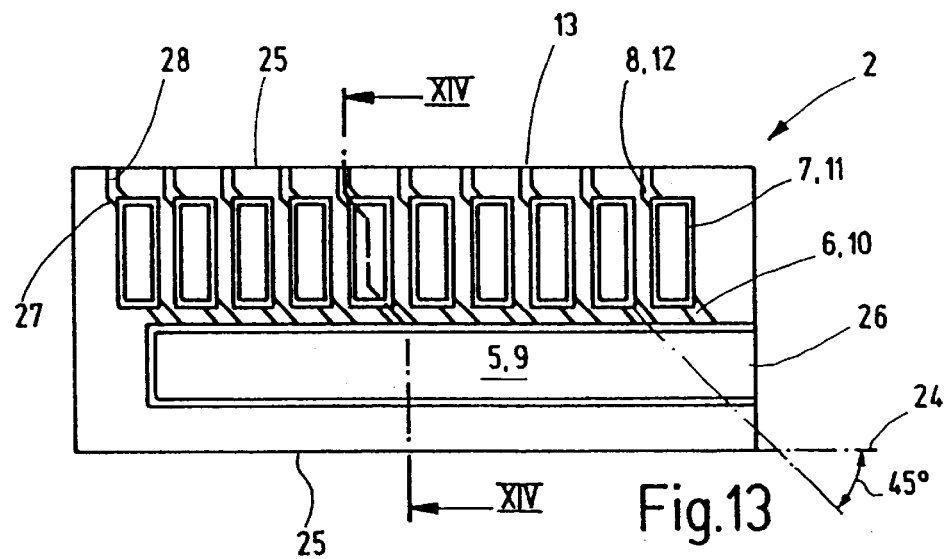
Figures 14, 15:
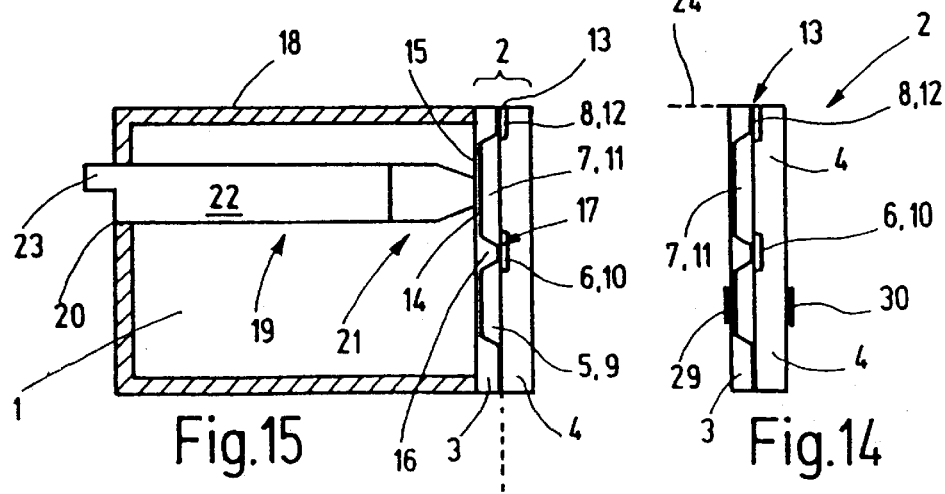

The invention is explained in more detail below using exemplary embodiments with reference to the drawing, in which:

FIG. 1 shows a top sectional view of a first exemplary embodiment of a printing chip, FIG. 2 shows a cross sectional view of a first exemplary embodiment of a printing chip, FIG. 3 shows another sectional view of a first exemplary embodiment of a printing chip, FIG. 4 shows another cross sectional view of a first exemplary embodiment of a printing chip, FIG. 5 shows another cross sectional view of a first exemplary embodiment of a printing chip, FIG. 6 shows yet another cross sectional view of a first exemplary embodiment of a printing chip, FIG. 7 shows another sectional view of a first exemplary embodiment of a printing chip, FIG. 8 shows a top sectional illustration of a second exemplary embodiment of a printing chip, FIG. 9 shows a cross sectional view of a second exemplary embodiment of a printing chip, FIG. 10 shows another top sectional view of a second exemplary embodiment of a printing chip, FIG. 11 shows a cross sectional view of a second exemplary embodiment of a printing chip, FIG. 12 shows a cross sectional view of a second exemplary embodiment of a printing chip, FIG. 13 shows a top view of a second exemplary embodiment of a printing chip, FIG. 14 shows another cross sectional view of a second exemplary embodiment of a printing chip, and In the figures, the section lines are provided with Roman reference numerals which indicate the corresponding figure showing the sectional illustration. No further reference is made thereto, therefore, in the following description of the figures. Incidentally, for the sake of clarity, the sectional areas are identified without hatching in the sectional illustrations.

FIG. 15 shows a printing head 1 working according to the ink-jet printing principle, in a diagrammatic, greatly simplified illustration. The printing head 1 has a printing chip 2 constructed from monocrystalline silicon. The printing chip 2 comprises two substrate parts 3 and 4 lying one on top of the other, the said substrate parts being connected to one another fixedly and inseparably at least in regions at their contact areas by means of silicon fusion bonding. Recesses 5 to 8 are introduced in the substrate parts 3 and 4, the recess 5 forming a medium supply chamber 9, the recess 6 forming a feeding duct 10, the recess 7 forming a medium chamber 11 and the recess 8 forming a connecting duct 12 and a squirting-out opening 13. The recesses 5 to 8 are each closed off by the opposite side of the corresponding substrate part 3 or 4, thereby forming self-contained chambers, only the squirting-out opening 13 being realized. For the hot medium to be squirted out, therefore, the resulting flow direction is from the supply medium chamber 9 via the feeding duct 10 into the medium chamber 11 and the connecting duct 12 to the squirting-out opening 13. In order that the medium can be squirted out from the medium chamber 11, the latter has a deflectable diaphragm 14 which forms one wall of the medium chamber and is formed by the bottom 15 of the recess 7.

All of the recesses 5 to 8 are, in cross section, trapezoidal or V-shaped, that is to say well-like, if they are produced by anisotropic etching. In other words, four pyramidally inclined side walls S of a recess 5 to 8 are at an angle of 54.7° with respect to the (100) crystal plane. It thus becomes clear that all of the recesses 5 to 8 can be introduced into the substrate parts 3 and 4 from the (100) crystal plane. If other etching processes or material-removing processes are employed, the side walls S may also be at a different angle, in particular perpendicular, with respect to the (100) crystal plane. When produced using other processes, the recesses may also have contours other than rectangular contours—as seen in plan view.

A web 16 is formed between the supply medium chamber 9 and the medium chamber 11 and separates the two chambers 9 and 11 from one another. The free end of the web 16 lies above the recess 6, thereby realizing the feed duct 10 and providing the overflow possibility for the medium from the supply medium chamber 9 to the medium chamber 11. It thus also becomes clear that the feeding duct 10 has a constricting point 17 or is designed as a constriction, the constricting point 17 preferably being formed by the free end of the web 16.

A supporting body 18, in which an actuator 19 is arranged, is also fitted to the printing chip 2. The left-hand end of the actuator 19 is lead through a perforation 20 in the supporting body 18 and held fixed therein. The right-hand, free end of the actuator 19 is connected to the diaphragm 14, so that electrical driving of the actuator 19 enables the diaphragm to be deflected in both directions. In a preferred embodiment, the actuator 19 is a piezoelectric element which is thermally decoupled from the diaphragm 14, which is hot during operation of the printing head 1, by means of a thermal barrier element 21. The actuator 19 is preferably designed integrally with the thermal barrier element 21, the electrodes which are required for driving the actuator 19 not being led over the entire length of the actuator 19, so that the thermal barrier element 21 is not activated when voltage is applied to the electrodes. The actuator 19 thus has a passive element and an active element, the active element being covered by the electrodes, of which only one electrode 22 is illustrated here, the terminal 23 of which electrode is led out from the supporting body 18. The other electrode (not visible) is situated at a distance parallel to the electrode 22 and is therefore not visible on the bar-type or lamellar actuator in FIG. 15. However, it also has a terminal.

Re the functioning: if an appropriate voltage, which may also be pulsed, is applied to the actuator 19, the diaphragm is deflected to the right, as a result of which the volume in the medium chamber is reduced, a drop of the medium thereby being forced out from the squirting-out opening 13 with a corresponding volume. The constricting point 17 is provided to ensure that the medium is not forced back from the medium chamber into the medium supply chamber 9. It goes without saying that when the actuator is deactivated, or in the case of a voltage of different polarity, the diaphragm 14 can also be deflected to the left, so that medium can be sucked from the supply medium chamber 9 into the medium chamber 11 via the constricting point 17. If appropriate, there may also be a constriction between squirting-out opening 13 and medium chamber 11. Consequently, with pulsed driving of the actuator 19, medium can be squirted out at high frequency from the squirting-out opening 13.

A first exemplary embodiment of a printing chip 2 is described below with reference to FIGS. 1 to 7. FIG. 1 shows one substrate part 3 of the printing chip 2, in which a plurality of recesses 7 are introduced, the said recesses each forming a medium chamber 11. The (100) crystal plane is in this case parallel to the plane of the drawing. A second crystal plane 24, for example the (011) plane, which is perpendicular to the (100) crystal plane, is parallel to a lateral edge 25 of the substrate part 3. It is evident that the longitudinal extent (throughflow direction) of the medium chambers 11 is approximately at an angle of 45° with respect to this second plane 24. The medium chambers 11 are essentially of rectangular design—as seen in plan view. It goes without saying that they may also be square. The recesses 7 for the medium chamber 11 are produced by anisotropic etching, resulting in the abovementioned angle of 45° of the side walls S relative to the (100) plane, as is illustrated in FIG. 2.

In the other substrate part 4 (FIG. 3), the remaining recesses 5, 6 and 8 are introduced from the (100) crystal plane. A second crystal plane 24' is perpendicular to the (100) plane of the substrate part 4 and—if the two substrate parts 3 and 4 lie one on top of the other—forms an angle of 45° with the second crystal plane 24 of the substrate part 3. This second plane 24' could be the (001) crystal plane, for example. The substrate part 4 is thus rotated by 45° relative to the substrate part 3 when the recesses 6 and 8 are introduced. The recesses 6 and 8, which form the feeding ducts 10 and connecting ducts 12, respectively, are in this case arranged offset with respect to one another, to be precise in such a way that, with the substrate parts 3 and 4 lying one on top of the other, the feeding ducts 10 and, respectively, connecting ducts 12 are in each case located at the corners of the medium chambers 11, as can be seen, in particular, in the diagrammatic plan view of the printing chip 2 according to FIG. 7. In this exemplary embodiment, the connecting ducts 12 and, respectively, feeding ducts 10 are oriented approximately perpendicularly to the second crystal plane 24'. The effect achieved as a result of this arrangement is that the medium flowing from the medium supply chamber 9 flows through the medium chambers 11 diagonally since the longitudinal extent of the medium chamber 11 is at an angle of 45° with respect to the second crystal plane 24. FIG. 3 also reveals that the supply medium chamber 9 has a supply opening 26, via which a medium can be fed in. In FIGS. 1 to 7 and 15, incidentally, identical or identically acting parts are provided with identical reference symbols. In the exemplary embodiment shown, the medium chambers 11, the feeding ducts 10 and the connecting ducts 12 with their squirting-out openings 13 are produced by anisotropic wet etching. On account of their geometry, the medium supply chamber 9 and the supply opening 26 are produced by a different material-removing process, in particular etching process.

The opposite side walls S of the recesses 6 to 8 can be seen in FIGS. 2, 4 and 5, in particular, these side walls forming an angle of 54.7° with respect to the (100) crystal plane, as occurs during the production of the recesses 6 to 8 by anisotropic etching in the monocrystalline silicon. The side walls S of the recesses 5 and 26 may form a virtually arbitrary angle with the (100) crystal plane.

A second exemplary embodiment of a printing chip 2 is explained in more detail below with reference to FIGS. 8 to 14. Parts which are identical or act identically to those in the figures described above are provided with identical reference symbols. FIG. 8 reveals that the medium chambers 11 or recesses 7 and the medium supply chamber 9 or recesses 5 are introduced in the substrate part 3. These recesses 5 and 7 are introduced by anisotropic etching into the substrate part 3. The longitudinal extent of the (as seen in plan view) rectangular medium chambers 11 is in this case essentially perpendicular to the second crystal plane 24. Accordingly, as shown in FIG. 10, the feeding ducts and, respectively, connecting ducts are oriented at an angle of preferably 45° with respect to this second crystal plane 24, so that in this exemplary embodiment, too, it is ensured that the medium flows through the medium chambers 11 essentially diagonally. FIG. 10 also shows that the connecting duct 12 comprises partial ducts 27 and 28, which merge with one another, one partial duct 27 being at an angle of 45° with respect to the second crystal plane 24. As a result, the drops ejected from the squirting-out openings 13 are squirted out essentially at right angles to the said second crystal plane 24. The recesses 6 and 8 are preferably not produced according to an anisotropic etching process in the substrate part 4, so that the substrate part 4 does not have to be rotated by 45° relative to the other substrate part 3 before the said recesses are produced. Consequently, the angle a (FIG. 10) between the recesses 6 and 8 and the second plane 24 can be chosen arbitrarily, about 45° being preferred.

The following medium guidance becomes clear from FIGS. 7, 13 and 14, in particular: the recesses 5 to 8 are introduced into the substrate parts 3 and 4 in such a way that the medium flows alternately through the substrate parts 3 and 4, respectively. This is realized particularly in the case of the exemplary embodiment according to FIG. 13 of the printing chip 2. In this case, the recesses 5 to 8 are respectively introduced alternately into the substrate parts 3 and 4. In the case of the exemplary embodiment of the printing chip according to FIG. 7, the contiguous recesses 5 and 6 are arranged in the substrate part 4. After the medium has flowed through these two recesses 5 and 6, it flows into the medium chamber 11, which is arranged in the other substrate part 3. Afterwards, the medium flows back into the substrate part 4 through the connecting ducts 12 to the squirting-out openings 13.

The recesses 6 to 8 and 26 can be produced by anisotropic etching processes on the two substrate parts 3 and 4, in which case, however, during etching and later connection, care must be taken to ensure that the corresponding substrate part 3 or 4 is oriented by 45° relative to the other substrate part 4 or 3, in order that, on account of the (100) crystal structure, these recesses form the desired angle of 45° with the 1second crystal plane 24 and 24', respectively. In other words, the etching perforated mask for the corresponding substrate part 3 or 4, on the substrate surface to be etched, has to be rotated by 45° in order that, on account of the crystal orientation, the recesses are produced in the correct positions. If other etching processes are employed for the recesses 5 to 8 and 26, the orientation of the second crystal plane 24 and 24', respectively, can be disregarded. The specifically advantageous etching process in each case is chosen for the recesses 5 to 8 and 26.

It is provided that those walls of the recesses 5 to 8 which come into contact with the medium are provided with a coating that is resistant to high temperatures. These walls of the recesses 5 to 8 are preferably additionally passivated by thermal oxide. Thermal oxide is very dense, ideally adhering silicon dioxide which is produced when silicon is exposed to an oxygen or water vapour atmosphere at high temperatures.

Furthermore, the printing chip 2 is assigned a heating device 29 (FIG. 14), which may be arranged on at least one of the substrate parts 3 or 4. As emerges from FIG. 14, the heating device 29 may be provided, in particular, in the region of the bottom of the recess 5, in order that the medium present in the supply medium chamber 9 can be kept at a temperature. It goes without saying, however, that such a heating device 29 may also be provided—also over a larger area—on the substrate part 4. The heating device 29 is preferably realized as a resistance heating device that is resistant to high temperatures, and in which the resistors are produced from hafnium diboride, in particular. Moreover, at least one temperature-resistant sensor 30 may be fitted to the printing chip 2, which sensor may be arranged on one of the substrate parts 3 and/or 4. The temperature sensor 30 and a detection device for the output signal of the sensor enable temperature monitoring of the printing chip 2. By appropriate arrangement on the printing chip 2, the temperature sensor 30 can also measure the medium temperature, in particular when it is located in a very thin-walled region of the substrate parts 3 and 4, these thin-walled regions, for example a bottom of a recess 5 to 8, coming into contact with the hot medium.

In particular, this printing chip 2 according to the invention is suitable for squirting out hot liquid metals, in particular metal alloys and/or solders. It goes without saying that glasses having a low melting point or the like can also be squirted out. In particular, the printing chip 2 is suitable for so-called chip sized packaging (CSP) and in the production of a flip chip connection (FC); in these processes, solder bumps are applied to chip substrates. The printing chip 2 is also suitable for a so-called rapid prototyping process, by means of which micromechanical components, in particular, can be produced by materials (including different materials) being squirted onto one another in a dropwise manner. The printing chip 2 according to the invention can thus be used in diverse production processes.

What is claimed is:

1. A print chip for a printhead functioning according to ink-jet principles, comprising:

at least two substrates formed exclusively from monocrystalline silicon lying one on the other defining at least one recess which forms a medium chamber, a deflectable diaphragm which forms a wall of the medium chamber, and a feeding duct opening into the medium chamber for feeding a liquid medium which is to be squirted out hot and a squirting-out opening connected to the medium chamber;

the feeding duct and a connecting duct that connects the squirting-out opening of the medium chamber, at 45° with respect to a second crystal plane perpendicular to a crystal plane of the silicon, the medium chamber being at 45° with a second crystal plane which is perpendicular to the crystal plane of the silicon;

the feeding duct and the connecting duct being perpendicular to the second crystal plane; and the respective crystal planes of the adjoining surfaces of the two substrates corresponding respectively to the crystal plane of the silicon.

2. The print chip of claim 1, wherein the feeding duct, the medium chamber, and the squirting-out opening are arranged in the printing chip such that the medium flows in turns through the two substrates.

3. The print chip of claim 1, further comprising a medium supply chamber positioned within the print chip and connected to the feeding duct.

4. The print chip of claim 1, wherein at least those surfaces of the two substrates that come into contact with the hot medium, are provided with a coating resistant to high temperatures.

5. The print chip of claim 1, wherein at least those surfaces of the two substrates that come into contact with the hot medium are passivated by thermal oxide.

6. The print chip of claim 1, wherein the two substrates are inseparably connected to each other through silicon fusion bonding.

7. The print chip of claim 1, wherein the recess of the medium chamber, the feeding duct, the squirting-out opening, and the medium supply chamber are produced through at least one of an anisotropic wet etching process and an anisotropic dry etching process.

8. The print chip of claim 7, wherein when the recesses are formed into the two substrate portions, the two substrates during the etching and during the subsequent bonding are twisted by 45° to each other with reference to the crystal plane perpendicular to the substrate surface.

9. The print chip of claim 1, wherein the medium chamber, the feeding duct, and the squirting-out opening when viewed in the flow direction of the medium have one of a trapezoidal and a V-shaped cross-section.

10. The print chip of claim 1, wherein the medium chamber in top view is configured rectangularly and that the feeding duct opens into the medium chamber in such a manner, and the squirting-out opening is connected to the medium chamber in such a manner that the medium flows through the medium chamber essentially diagonally.

11. The print chip of claim 1, wherein the medium chamber, the feeding duct, the squirting-out opening and the medium supply chamber are introduced from the crystal plane of the silicon.

12. The print chip of claim 1, wherein a bottom of the at least one recess forms the diaphragm.

13. The print chip of claim 1, wherein the connecting duct has at least one partial duct perpendicular to the second crystal plane, the squirting-out opening being formed by an orifice of the partial duct at an edge of at least one of the two substrates.

14. The print chip of claim 1, wherein the feeding duct has a constricting point.

15. The print chip of claim 1, wherein the feeding duct is configured as a constriction.

16. The print chip of claim 1, wherein in one of the two substrates are situated the medium chamber and the supply chamber, delimited from each other by a web, and the feeding duct is configured in the other substrate and is located below a free end of the web.

17. The print chip of claim 1, further comprising a plurality of medium chambers, a plurality of feeding ducts, a plurality of connecting ducts, and a plurality of squirting-out openings.

18. The print chip of claim 1, further comprising at least one heating element located on an outer side of at least one of the two substrates.

19. The print chip of claim 1, further comprising at least one temperature sensor located on an outer side of at least one of the at least two substrates.

20. The print chip of claim 1, wherein the diaphragm has a thickness of approximately 20 $\mu$m to 100 $\mu$m.

21. The print chip of claim 1, wherein the temperature of the liquid medium is up to in excess of 1000° C.

22. The print chip of claim 1, wherein the two substrates are incorporated into a printhead.

* * * * *